United States Patent
Orban

(10) Patent No.: US 6,618,486 B2
(45) Date of Patent: Sep. 9, 2003

(54) CONTROLLER FOR FM 412 MULTIPLEX POWER REGULATION

(76) Inventor: Robert A. Orban, 2413 Lincoln Ave., Belmont, CA (US) 94002-1423

(*) Notice: Subject to any disclaimer, the term of this patent is extended or adjusted under 35 U.S.C. 154(b) by 0 days.

(21) Appl. No.: 09/848,389

(22) Filed: May 2, 2001

(65) Prior Publication Data

US 2003/0142840 A1 Jul. 31, 2003

Related U.S. Application Data

(60) Provisional application No. 60/201,486, filed on May 3, 2000.

(51) Int. Cl.[7] ............................................... H04H 5/00
(52) U.S. Cl. .......................... 381/108; 381/1; 381/2; 381/3; 381/4; 381/14; 381/104; 381/106; 381/107
(58) Field of Search ............................. 381/2, 3, 4, 14, 381/104–108; 332/125

(56) References Cited

U.S. PATENT DOCUMENTS

| | | |
|---|---|---|
| 4,103,243 A | 7/1978 | Orban |
| 4,208,548 A | 6/1980 | Orban |
| 4,249,042 A | 2/1981 | Orban |
| 4,412,100 A | 10/1983 | Orban |
| 4,466,119 A | 8/1984 | Peters et al. |
| 4,843,626 A | 6/1989 | Werrbach |
| 5,528,695 A | 6/1996 | Klippel |
| 5,796,842 A | 8/1998 | Hanna |
| 5,920,631 A | 7/1999 | Andres |
| 6,195,438 B1 | 2/2001 | Yumoto et al. |

OTHER PUBLICATIONS

PCT Search Report for Int'l application No. PCT/US02/13569, date of mailing Nov. 27, 2002, 5 pages.

*Primary Examiner*—Forester W. Isen
*Assistant Examiner*—Tony M. Jacobson
(74) *Attorney, Agent, or Firm*—Blakely, Sokoloff, Taylor & Zafman LLP

(57) ABSTRACT

A feedback controller, embedded in an FM audio processor, that controls the "integrated multiplex power" to the requirements of ITU-R 412 (2.51) is disclosed. This regulation specifies the maximum power, which is the same as the power produced by a sinewave modulating the carrier ±19 kHz (where ±75 kHz is 100% peak modulation). The controller applies the square of the multiplex signal to an integrator. A constant is removed from the integrator; representing the maximum power threshold. The output of the integrator is sampled periodically with a sample-and-hold circuit. A second integrator receives the output of the sample-and-hold. The output of the second integrator circuit is added to the threshold setting of a compressor, which determines the average power output of the compressor. The output of the compressor is applied through a peak controller to the input of the multiplex coder, closing a feedback loop, which controls the integrated multiplex power to a preset threshold.

11 Claims, 2 Drawing Sheets

CONTROLLER FOR FM 412 MULTIPLEX POWER REGULATION

This application claims the benefit of provisional application 60/201,486 filed May 3, 2000.

BACKGROUND OF THE INVENTION

1. Field of the Invention

The invention relates to the control of power in an FM signal.

2. Prior Art

The International Telecommunications Union (Radio) (ITU-R) has published Recommendation 412. Among other things, this requires that the maximum power in the, frequency modulated (FM) stereo multiplex signal (including the pilot tone) shall not exceed the power produced by a sinewave that FM-modulates the carrier to a frequency deviation of ±19 kHz. This power is measured by integrating the signal, over a 60-second period. The exact wording is as follows:

2.5.1 For the radio-frequency protection ratios given in FIG. 1 and Table 3, it is assumed that the maximum peak deviation of ±75 kHz is not exceeded. Moreover, it is assumed that the power of the complete multiplex signal (including pilot-tone and additional signals) integrated over any interval of 60 s is not higher than the power of a multiplex signal containing a single; sinusoidal tone which causes a peak deviation of ±19 kHz.

> NOTE—The power of a sinusoidal tone causing a peak deviation of ±19 kHz is equal to the power of the coloured noise modulation signal according to Recommendation ITU-R BS.641, i.e. a coloured noise signal causing a quasi-peak deviation of ±32 kHz.

FM broadcasters throughout the world commonly use audio processing to reduce the peak-to-average ratio of the audio, improving the signal-to-noise ratio at the receiver and increasing perceived loudness for a given setting of a receiver's volume control. An example of such a system is Optimod-FM Model 8200, manufactured by Orban, Inc.

Such systems usually combine a compressor, a high-frequency limiter, a peak limiter, and an overshoot-compensated filter. A stereo encoder (to create the standard "pilot tone" stereo baseband) may also be included in the system. Such a system is described in U.S. Pat. No. 4,103,243, and improvements thereon are described in U.S. Pat. Nos. 4,249,042 and 4,412,100.

Measurements have shown that it is not unusual for such a system to produce average power exceeding the ITU-R recommendation by 6 dB or more when the system modulates the FM carrier ±75 kHz, which is the typical 100% peak modulation limit. Indeed, measurements have shown that a significant number of commercial recordings exceed the ITU-R power limit-without any further audio processing.

It is therefore clear that some means must be found to meet the specification when processing arbitrary program material. Previously, this was done with an open loop, by defining presets for the audio processor that produce extremely conservative processing. By then testing the processor with these presets and known "difficult" program material, one could have reasonable confidence that the processor's output would not exceed the limits specified by the recommendation.

SUMMARY OF THE INVENTION

A method and apparatus for controlling the integrated multiplex power in a frequency modulated in (FM) processor is described. A power determining circuit determines the power in an input signal by squaring the signal. The result of the squaring is coupled, to a combining circuit, which combines the squared, signal with a threshold control representing the square of the maximum allowed power. This combined signal is integrated and then sampled. The results of the sampling are again integrated, clamped and used to control a compressor. The output of the compressor, after passing through a peak limiter, provides an output signal. Consequently, feedback is provided to the compressor through the loop comprising the squaring circuit, threshold control, first integrator, sample-and-hold circuit, second integrator and clamping circuit.

DETAILED DESCRIPTION OF THE PRESENT INVENTION

Over of the Present Invention

Figure 1:
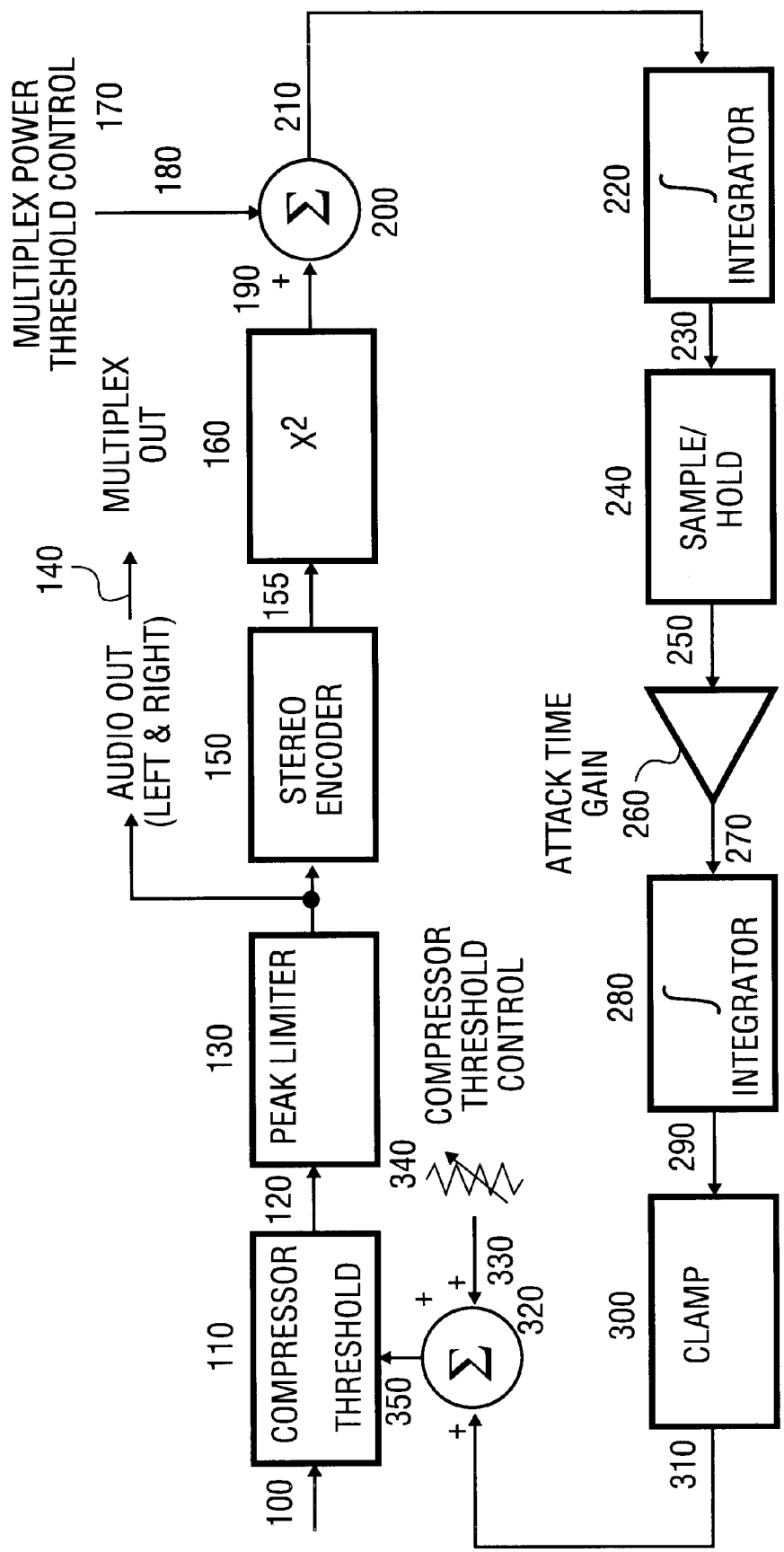
FIG. 1 is a block diagram illustrating a currently preferred embodiment of the present invention.

Improvement in controlling the integrated multiplex power in an FM signal using a closed loop system where the integrated multiplex power is sensed is disclosed. In the following description specific details for a currently preferred embodiment are disclosed. It will be apparent that the present invention may be practiced without these details. In another instance, details of well-known circuits have not been set forth in order not to unnecessarily obscure to the present invention.

In the present invention, the sensed power is integrated, compared to a threshold, and fed back in the audio processor in a manner allowing reduction in the average multiplex power. This can cause several problems solved with the present invention. The main problems are achieving audibly unobtrusive action when the controller reduces power, and achieving stability of the feedback loop. As will be seen, these two problems are interrelated.

Briefly, the system in the present invention can be implemented in either a continuous-time (analog), or sample-data (digital) environment. The present invention applies the square of the multiplex signal (representing the power) to an integrator. A constant is removed from the integrator, representing the maximum power threshold. The output of the integrator is sampled periodically with a sample-and-hold circuit. A second integrator receives the output of the sample-and-hold circuit. The output of the second integrator circuit is added to the threshold setting of a compressor, which determines the average power output of the compressor. The output of the compressor is applied through a peak controller to the input of the multiplex coder, closing a feedback loop, which controls the integrated multiplex power to a preset threshold.

The second integrator makes the feedback loop a "Type-1" loop (having zero "positional error"), and causes the steady-state multiplex power error to be forced to zero after a finite attack time, which is approximately two seconds in the currently preferred embodiment.

The compressor is very often a multiband compressor, in which the input signal is divided into parallel frequency bands, and each of these bands is processed semi-independently. (There may be cross coupling, as taught in U.S. Pat. No. 4,249,042.) Multiband compression is desirable because it prevents spectral gain modulation—for example, a loud bass note cannot unnaturally modulate the loudness of a midrange musical instrument because the bass and midrange are processed separately.

The present invention achieves gain reduction by decreasing the threshold of compression of the various compressors, forcing them to increase their gain reductions in a frequency-dependent way. By doing so, the present invention prevents wideband gain reduction artifacts. In this sense, it operates in a manner somewhat similar to U.S. Pat. No. 4,843,626 (Multiband limiter with automatic limiting threshold compensation, issued to Werrbach). However, in contrast to the teachings of Werrbach, the present invention uses a complex level detector with two integrators and a sample-and-hold circuit. The Werrbach patent also applies to the control of the peak level of the output of a multiband compressor, not the integrated multiplex power as does the present invention.

The output of the compressor is usually connected to the input of a multiplex encoder through a peak limiting system, which may consist of various stages of clipping, overshoot compensation, and/or look-ahead limiting. This may add considerable delay to the system. Additionally, the attack and release time constants of the compressor(s) that implement the actual gain reduction may have delays associated with them.

Any feedback system is subject to instability, and a complex non-linear feedback system as in the present invention can be difficult to stabilize, particularly with two integrators in the loop. It was discovered that adding a sample-and-hold with a sampling period of approximately five seconds helps stabilize the loop. This sample-and-hold is located between the first and second integrators. Adjusting the attack time to two seconds or longer also helps stabilize the loop.

Description of Specific Embodiment

Referring to FIG. 1, the invention receives stereophonic audio on line 100. This audio may be pre-processed by other elements, such as an automatic gain control circuit or an equalizer. (For simplicity, only one connection line is shown for both left and right stereophonic channels.) The input signal is applied to compressor 110, which may be either a wideband or multiband compressor. (It is multiband in one currently preferred embodiment.)

Peak limiter 130 receives the output of compressor 110 through line 120. This peak limiter eliminates short-duration peaks that pass through compressor 110 for any reason. The peak limiter may use any one of several well-known technologies. It is common in the prior art for such a peak limit to consist of a combination of distortion-cancelled clipping (as taught by U.S. Pat. No. 4,208,548) and overshoot compensation, but there are many different possibilities that are known in the prior art.

The output of peak limiter 130 (on line 140) is the discrete left and right outputs of the peak limiting system. This stereophonic pair may be applied to an external stereo encoder, possibly at a remotely located transmitter. In this case, the signal on line 140 may be passed through a link that overshoots, and the present invention must provide for this possibility by enabling its operator to change the multiplex power threshold so that it is higher than the ITU-R 412 specification. By doing so, the operator can compensate for the fact that the overshoot in the link causes the peaks to be magnified, forcing the gain between line 140 and the external stereo encoder to be decreased to accommodate the overshoot. This will also reduce the integrated multiplex power, and increasing the threshold above that set forth in the ITU-R specification can compensate for this decrease.

The left and right signals on line 140 drive the stereophonic encoder 150. This generates the stereophonic multiplex signal, which appears on line 155. Encoder 150 may also incorporate a composite level processor that clips or otherwise reduces the peak level of the multiplex signal before it is applied to line 155.

Line 155 is the baseband output of the audio processing system. One goal of the present invention is to ensure that the integrated multiplex power on line 155 does not exceed the ITU-R specification. By doing so, the present invention also controls the signal level on line 140, and therefore controls the integrated multiplex power output of any multiplex encoder driven by line 140.

Squaring means 160 receives the multiplex signal on line 155. The squaring means allows computation of the mean square signal, which is proportional to the square of the power on line 155. There is no need to apply the square root function because the threshold can be calibrated in terms of the square of the integrated multiplex power. The main goal of the feedback system then becomes to hold the integrated square of the multiplex power at or below this threshold, which will achieve the desired result of controlling the integrated multiplex power to a threshold.

The squared multiplex signal on line 190 is combined (in summing circuit 200) with a multiplex power threshold signal on line 180. If the signal on line 190 is positive (which it ordinarily will be because of the squaring function 160), then the threshold signal on line 180 must be negative and equal to the negative of the square of the multiplex power threshold.

Integrator 220 receives two superposed signals (from lines 180 and 190) on line 210. One is the square of the multiplex power, and the other is the threshold control signal. The output of integrator 220 (on line 230) is thus the sum of the square of the integrated multiplex power and the integrated threshold. The goal of the feedback loop is to hold the long-term average signal on line 230 at zero or below (if integrator 220 is non-inverting). This ensures that the ITU-R specification is obeyed.

Sample-and-hold circuit 240 periodically samples the signal on line 230. (The signal is sampled once every five seconds in one currently preferred embodiment.) The output of the sample-and-hold on line 250 is applied to attack time gain 260, which determines how quickly integrator 280 is allowed to charge and discharge. If the signal on line 270 is not zero, integrator 280 will charge or discharge, changing the signal on line 290. The signal on line 290 is applied to clamp 300, which prevents the output signal of integrator 280 from ever exceeding a value that would cause the threshold of compressor 110 to increase. (This would mean that the multiplex power controller was causing a power increase instead of a decrease, which is not desired.)

The output signal of clamp 300 (on line 310) is summed with the output of the compressor threshold control 340 in summing circuit 320. Compressor threshold control 340, which is not necessary for the present invention, may be present in most embodiments of the audio processing system. (In some embodiment, the threshold may be fixed and, control 340 would therefore not be present.) Control 340 has the effect of adding or subtracting a fixed level to the signal on line 310. The power control feedback loop will eventually cause the signal on line 350 to reach the value that correctly closes the feedback loop, regardless of the level on line 330, provided only that clamp 300 is passing signal linearly and not clamping it. The signal on line 350 is the sum of the signal on line 310 and the signal on line 330. If control 340 is manually set so that the feedback loop causes the signal on line 310 to become relatively small, it can be seen that a correct manual setting of control 340 thus minimizes the amount of gain change that must be produced by the power controller feedback loop, resulting in a more natural-sounding control by the loop.

Regardless of whether control 340 is present, the purpose of the signal on line 310 is to reduce the threshold of compressor 110. By reducing the threshold, the signal on line 310 causes more gain reduction to occur in compressor 310, which reduces the power on line 120. This closes the feedback loop.

If compressor 110 is a multiband compressor, the signal on line 310 changes the threshold of each band compressor. It is unnecessary to change each individual band threshold by an equal amount if unequal threshold changes can result in smoother action from the power controller of the present invention. However, in one currently preferred embodiment, all compressor thresholds change by the same number of decibels in response to changes on line 310.

In one currently preferred embodiment, the system is a sample-data system. Blocks 110, 240, 260, 280, and 300 operate at a sample rate of 32 kHz, while block 130 typically operates at 256 kHz and blocks 150 and 160 operate at 512 kHz. Blocks 200 and 220 operate at, 128 kHz, which is close to the lowest sample rate that can correctly represent a 0 to 53 kHz multiplex baseband signal.

In one currently preferred embodiment, all blocks are implemented as software in Digital Signal Processing (DSP) integrated circuits. However, other digital implementations would be obvious to one skilled in the art. Appropriate digital or software implementation of all blocks is well known to those skilled in the art.

Further, all blocks could be implemented practically in analog form and could be embedded in an analog FM processor. Analog sample-and-hold circuits are very well known in the prior art, as are analog integrators (implemented with operational amplifiers, resistors, and capacitors). A difficult block to implement in analog is the squaring circuit 160, however, even this function is readily available in integrated circuits from vendors such as Analog Devices and Burr-Brown.

Figure 2:
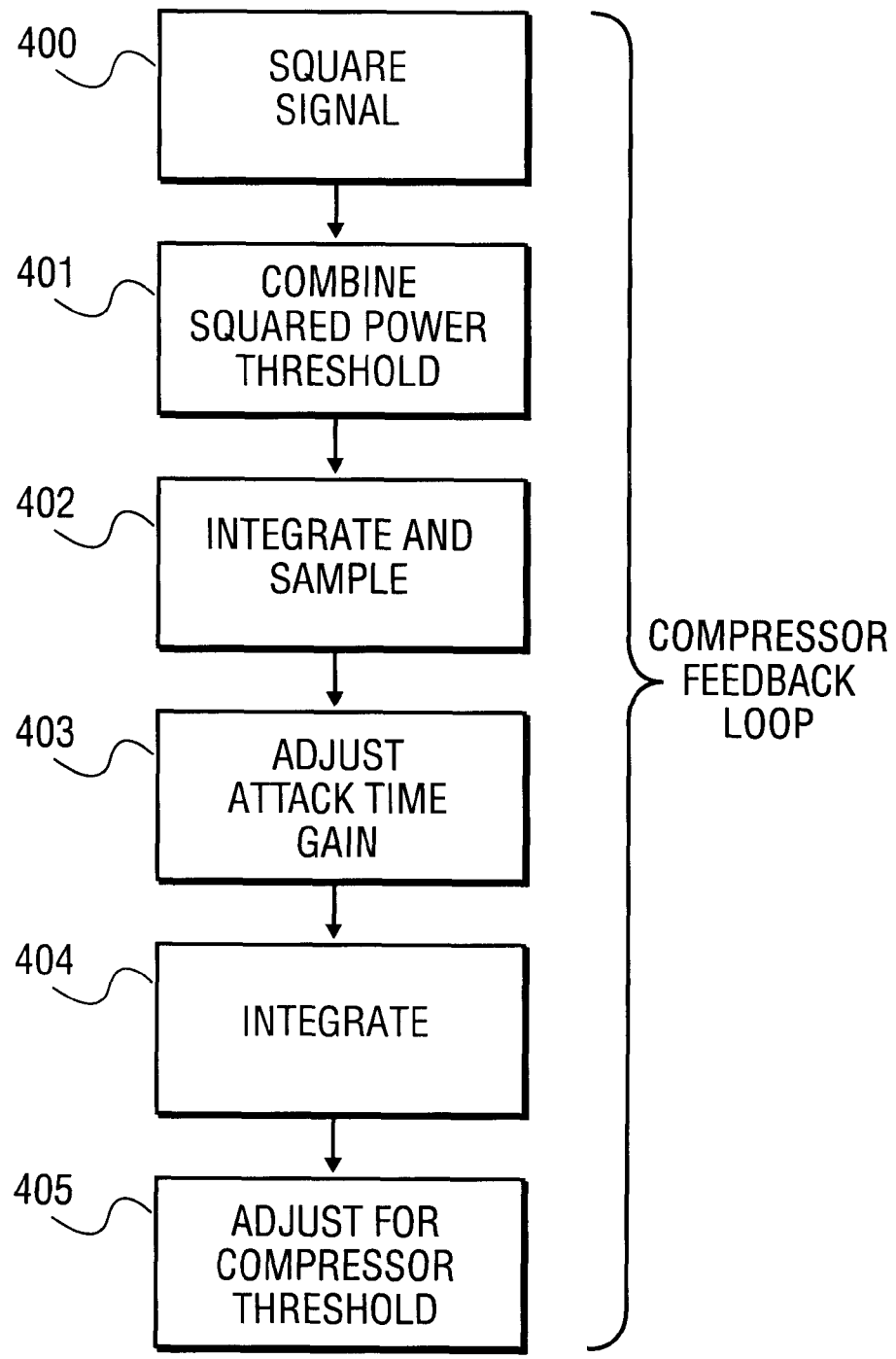
FIG. 2 illustrates the method of the present invention.

The method of the present invention is shown in FIG. 2. The processing in the compressor feedback loop is shown by steps 400–405. In step 400, the output signal of the compressor (after encoding to provide a multiplex stereophonic signal) is squared. Next as indicated by step 401, the results of the squaring step are combined with a threshold level that represents the maximum allowed power and, more exactly, the square of the maximum allowed power. Now, this combined signal is integrated and sampled as shown by step 402. The samples are adjusted for attack time, which, in effect, determines how quickly integration occurs in step 404. The integrated signals resulting from step 404 are adjusted to a level suitable for the compressor and are used to control the compressor. Thus, an input signal to the compressor, through the feedback loop, controls the integrated multiplex power. More particularly, in one embodiment, the invention is used to meet the requirements of ITU-R412.

Thus a feedback system for implementing the requirements of ITU-R recommendation 412 has been described. By using a novel feedback loop containing two integrators and a sample-and-hold circuit, and by feeding the error signal back to the threshold of the FM processing system's multiband compressor, the present invention controls the integrated multiplex power in an accurate, stable, and audibly unobtrusive manner.

What is claimed:

1. A system for controlling the integrated multiplex power in a frequency modulated (FM) processor comprising:

a power determining circuit for determining power, coupled to receive an input signal;

a first integrator coupled to receive an output of the power determining circuit;

a sample-and-hold circuit coupled to receive an output of the first integrator and;

a second integrator coupled to receive an output of the sample-and-hold circuit, an output of the second integrator being used to control the power level of the input signal.

2. The system defined claim 1 wherein the power determining circuit is a squaring circuit.

3. The system defined by claim 2 wherein the output of the squaring circuit is combined with a power threshold level before being coupled to the first integrator.

4. The system defined by claim 3 including a compressor controlled by the output of the second integrator.

5. A feedback loop for controlling a compressor in an FM system comprising:

a squaring circuit for squaring an input signal to the compressor;

a combining circuit for receiving the output of the squaring circuit and a signal representing maximum multiplex power a first integrator for receiving the combined signal from the combining circuit;

a sample-and-hold circuit coupled to an output of the first integrator;

an attack time gain control for controlling a second integrator coupled to the output of the sample-and-hold circuit.

6. The feedback loop defined by claim 5 including a clamping circuit coupled to receive the output of the second integrator for assuring that the signal applied to the compressor always decreases the output level of the compressor.

7. The feedback loop defined by claim 6 including a compressor threshold control for summing a fixed signal with the output of the clamping circuit, so that this sum determines the threshold of compression of the compressor disposed between the output of the clamping circuit and the compressor.

8. The feedback loop defined by claim 7 including a stereophonic encoder for encoding the left and right signals for providing a multiplex signal to the squaring circuit.

9. A method for controlling a compressor in a frequency modulated (FM) processor comprising:

squaring a first signal derived from an output of the compressor;

combining the squared signal with a threshold level representing maximum power;

integrating the combined signal;

sampling the integrated signal; and integrating the sampled signal where the speed of the integration is a function of a desired attack time; and applying the results of the second integration to a compressor for controlling the power level at the output of the compressor.

10. The method defined by claim 9 including the additional step of clamping the signal resulting from the second integration so as to assure that the compressor is used to reduce power.

11. The method defined by claim 9 including the additional step of encoding the left and right audio signals into a multiplex signal, which is then squared in the squaring step.

* * * * *